United States Patent [19]

Teo et al.

[11] Patent Number: 5,331,200
[45] Date of Patent: Jul. 19, 1994

[54] LEAD-ON-CHIP INNER LEAD BONDING LEAD FRAME METHOD AND APPARATUS

[75] Inventors: Boon C. Teo, Mandarin Gardens; Tjandra Karta, Asia Garden; Siu W. Low, Singapore, all of Singapore

[73] Assignee: Texas Instruments Incorporated, Dallas, Tex.

[21] Appl. No.: 954,183

[22] Filed: Sep. 30, 1992

[51] Int. Cl.⁵ .................. H01L 23/48; H01L 29/44; H01L 25/52; H01L 29/60
[52] U.S. Cl. .................................. 257/666; 257/691
[58] Field of Search ............... 257/668, 676, 691, 673

[56] References Cited

U.S. PATENT DOCUMENTS

| | | | |
|---|---|---|---|
| 4,754,317 | 6/1988 | Comstock et al. | 357/70 |
| 4,801,999 | 1/1989 | Hayward et al. | 257/668 |
| 5,068,712 | 11/1991 | Murakami et al. | 257/676 |

OTHER PUBLICATIONS

William C. Ward, "Volume Production of Unique Plastic Surface-Mount Modules for the IBM 80-NS 1-Mbit DRAM Chip by Area Wire Bond Techniques," 0569-5503/88/0000-0552, IEEE, pp. 552-557.

*Primary Examiner*—Rolf Hille
*Assistant Examiner*—S. V. Clark
*Attorney, Agent, or Firm*—Robby T. Holland; Rene E. Grossman; Richard L. Donaldson

[57] ABSTRACT

A multi-level lead frame configuration (114) for an integrated circuit chip (116) comprises a main lead frame (115) having a plurality of lead frame bond fingers (122 and 124) that directly connect to a plurality of bond pads (126) on the integrated circuit chip (116). Associated with the main lead frame (115) is a bus bar lead frame (128 and 130) having a plurality of bus bar lead fingers (118 and 120) that directly connect to a second plurality of inner bond pads (126) on the integrated circuit chip (116). The bus bar bond fingers (118 and 120) associate with the main lead frame (115) and main lead frame bond fingers (122 and 124) to permit a lead-on-chip configuration of the main lead frame and the bus bar lead frame.

7 Claims, 3 Drawing Sheets

LEAD-ON-CHIP INNER LEAD BONDING LEAD FRAME METHOD AND APPARATUS

TECHNICAL FIELD OF THE INVENTION

The present invention generally relates to packaging of electronic devices and more particularly relates to a lead-on-chip inner lead bonding method and apparatus that permits direct inner lead bonding of a lead frame to bonding pads of an integrated circuit chip.

BACKGROUND OF THE INVENTION

Lead-on-chip semiconductor packaging structures use a lead frame that extends over and is adhesively joined to the surface of the integrated circuit chip. The lead frame has numerous bond fingers to carry signals between the chip and external circuitry. The bond fingers electrically connect via numerous bonding wires to bond pads typically located in a center row of the chip's top surface. In most lead frame configurations, the bond fingers appear on two sides of the bond pads. In lead-on-chip packages, a double-sided adhesive tape is used to attach the bond fingers to the chip and provide insulation between the chip and bond fingers. An advantage of this type of configuration is that power buses for the circuitry of the integrated circuit chip may be located external to the chip. In other words, the power buses may be part of the lead frame design. One merit of this packaging concept is that the power buses of the circuitry can be located external to the chip as part of the lead frame design. This reduces the chip size and improves the plastic-to-silicon ratio in the lead-on-chip package. The buses run alongside the bond pads. Connections between the bond pads and the bond fingers are, therefore, made by routing the bonding wires around the buses.

More modern lead-on-chip configurations avoid the use of bonding wires and, instead, connect bond fingers from a lead frame directly to the bond pads on the chip. Techniques that use these configurations are called inner lead bonding or ILB techniques. Power buses that run alongside the bond pads and must be routed around limit the ability to employ ILB techniques. With the power bus obstructing access to the bonding pads of the integrated circuit, it is not possible to easily access the bond pads with ILB lead frames.

There is a need, therefore, for a method to employ inner lead bonding techniques on an integrated circuit chip that uses lead-on-chip packaging.

There is a need for an apparatus that functions as a power bus for an integrated circuit chip and that permits an inner leading bonding adaptation to a lead-on-chip lead frame configuration.

SUMMARY OF THE INVENTION

The present invention, accordingly, provides a lead-on-chip lead frame configuration for use with inner lead bonding integrated circuit packaging techniques and that overcomes or reduces disadvantages and limitations associated with prior lead frame design and lead-on-chip circuitry connection methods.

One aspect of the invention is a multi-level lead frame configuration for an integrated circuit chip that has a main lead frame with a plurality of lead frame bond fingers. In the present invention, the bond fingers directly connect to a first plurality of inner bond pads on the integrated circuit chip. Additionally, the invention uses at least one bus bar that has a plurality of bus bar bond fingers to directly connect to a second plurality of inner bond pads on the integrated circuit chip. The bus bar bond fingers associate with the lead frame bond fingers to permit a lead-on-chip configuration of the main lead frame and the bus bar.

A technical advantage of the present invention is that it uses a double-level or multi-level lead frame configuration to facilitate direct inner lead bonding of the bond fingers with the bond pads using a half-etched lead frame for a single row of bond pads in the center of the chip. This permits inner lead bonding for both the power bus and the main lead frame.

Another technical advantage of the present invention is that it avoids the need for bonding wire by using inner lead bonding techniques, while at the same time employing lead-on-chip center bond connecting methods.

Another technical advantage of the present invention is that the bus bar pieces are downset at a different location from the main lead frame so that the bus bar may be stacked on the main lead frame. Additionally, in the present invention the bus bar bond fingers and the lead frame bond finger are on a different plane from that of the bus bar and main lead frame closer to the chip surface plane. This double-level configuration permits connecting the bus bar and the main lead frame with various different attaching methods, including an external lead bonding method and an insulating double-side adhesive tape.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF THE INVENTION

The preferred embodiment of the present invention is best understood by referring to the FIGURES wherein like numerals are used for like and corresponding parts of the various drawings.

Figure 1:
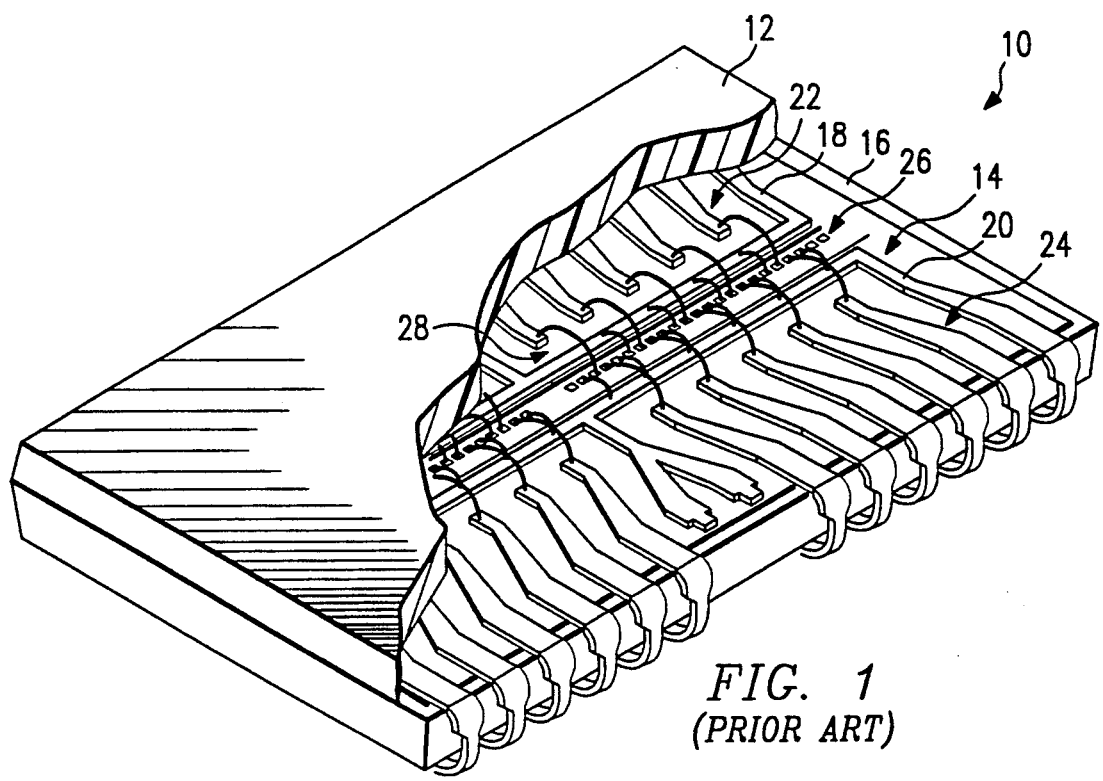
FIG. 1 illustrates a conventional lead frame configuration for lead-on-chip packaging.

FIG. 1 is an exploded view of the conventional lead-on-chip configuration for integrated circuit chip package 10. Within package 10 and under protective layer 12, lead frame 14 provides connections to circuitry within integrated circuit chip 16. Lead frame 14 includes two bus bars 18 and 20 and two sets of bond fingers 22 and 24. Connections of bus bars 18 and 20 and bond fingers 22 and 24 to bond pads 26 are made by bond wires 28. Several new techniques now permit inner lead bonding (ILB) of a lead frame to provide for direct connection of lead frame bond fingers to bond pads. The configuration of FIG. 1, however, prohibits this. This is because bus bars 18 and 20 on lead frame 14 form a barrier to bond pads 26.

Figure 2:
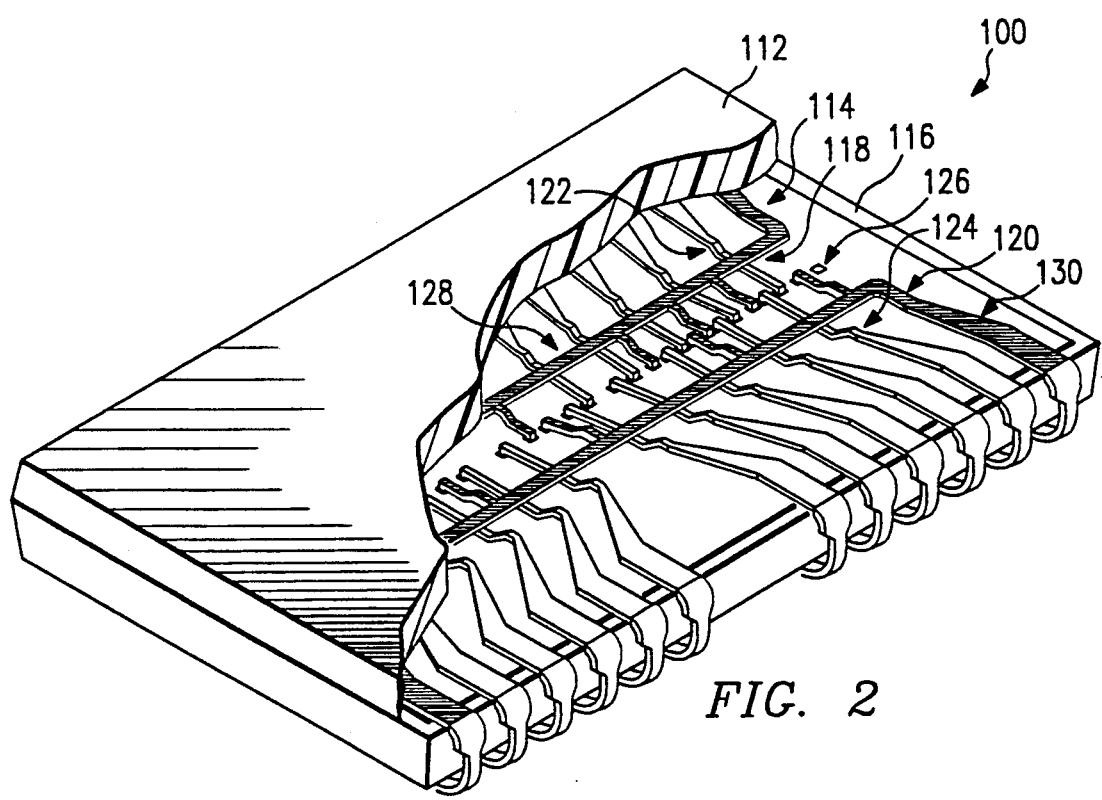
FIG. 2 provides a cut-away isometric perspective of the lead frame and the bus bar configuration of the preferred embodiment.

FIG. 2 illustrates the preferred embodiment of the present invention and shows how the limitations of the prior art are overcome. In particular, integrated circuit chip package 100 of FIG. 2 includes dual-level lead frame configuration 114 that is formed around or folded over the sides of integrated circuit chip 116. Dual-level lead frame 114 includes ILB bus bar bond fingers 118 and 120, as well as ILB lead frame fingers 122 and 124. Bus bar bond fingers 118 and 120 and lead frame bond fingers 122 and 124 connect directly to bond pads 126. This avoids the need to use bonding wires and provides to integrated circuit chip package 100 all of the benefits associated with inner lead bonding techniques. Bus bar bond fingers 118 and 120 are integral to bus bar pieces 128 and 130. Bus bar pieces 128 and 130 are separate bars that are attached to both main lead frame fingers 122 and associated support structure 132 and 134 of lead frame 114.

Figure 3A:
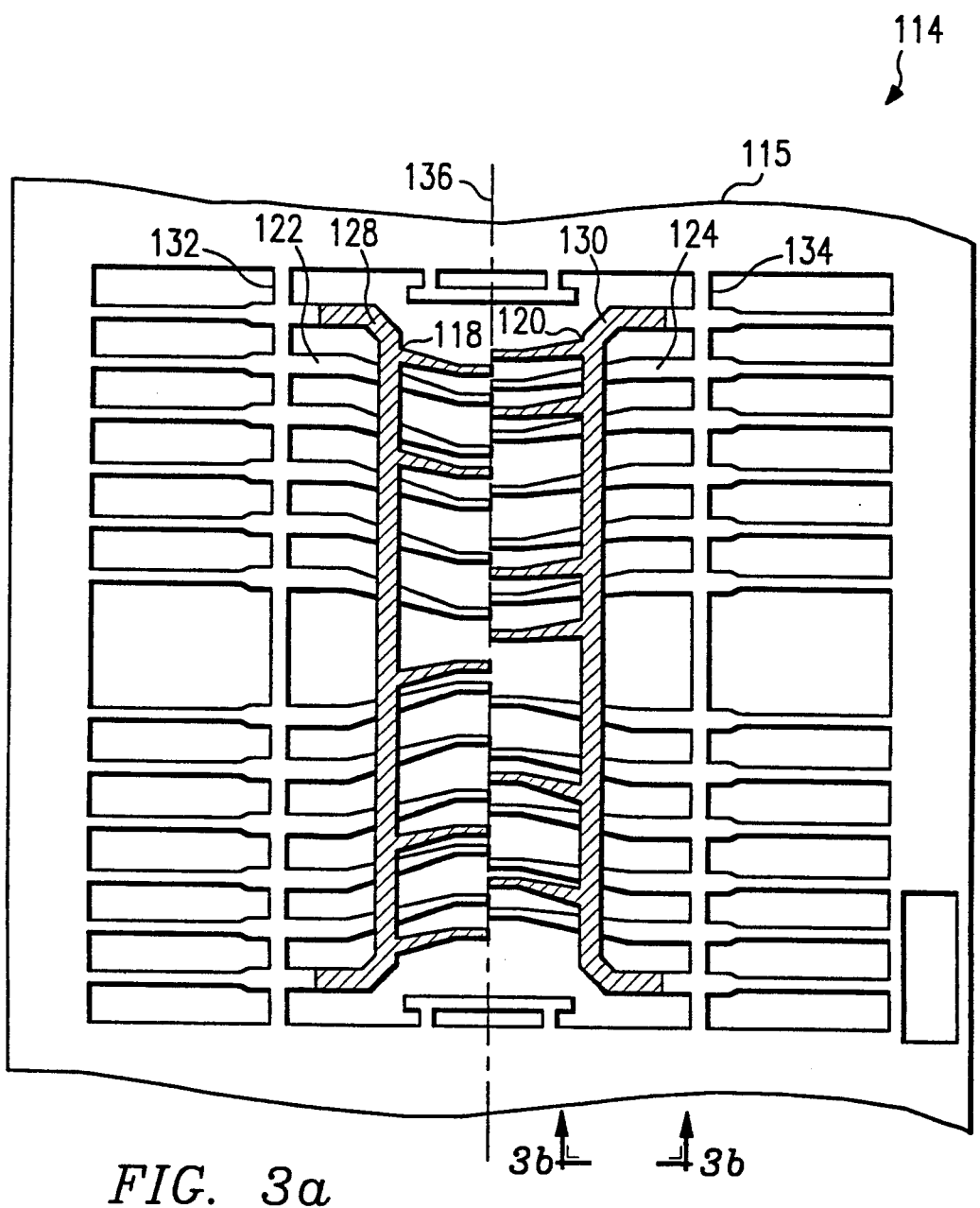
FIGS. 3a and 3b illustrate top and side views, respectively, of certain portions of the preferred embodiment of the present invention.
Figure 3B:
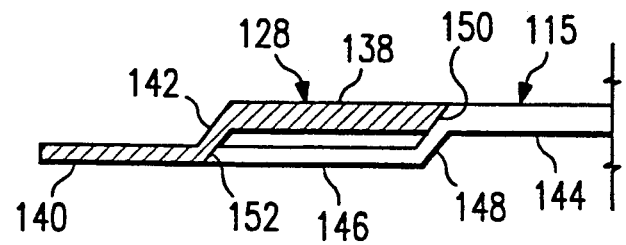

FIGS. 3a and 3b illustrate the construction of the preferred embodiment of the present invention. In particular, FIG. 3a shows a top view of the double-level lead frame 114 of the preferred embodiment in a fabrication pattern that may be employed using established fabrication techniques. Double-level lead frame 114 is formed from essentially three pieces. They include main lead frame 115, bus bar frame 128 and bus bar frame 130. Main lead frame bond fingers 122 and 124 protrude to centerline 136 for contacting bond pads 126 upon being placed over an integrated circuit chip. For power bus connects, bus bar frames 128 and 130 provide bus bar bond fingers 118 and 120, respectively, that also extend to centerline 136 for connecting to appropriate ones of bond pads 126.

In order to stack bus bar ILB frame 128 over main lead frame 115, it is necessary to have the two types of lead frame structures formed in a double-level configuration. FIG. 3b illustrates a side perspective view of the relationship between bus bar lead frame 128 and main lead frame 122. In particular, bus bar lead frame 128 has an upper level portion 138 that goes to a lower level portion 140 by way of connecting piece 142. Also, main lead frame 115 includes upper portion 144 that connects to lower portion 146 by way of connecting piece 148. Note that at points 150 and 152, bus bar lead frame 128 joins main lead frame 115. This may be accomplished by any one of numerous well-established external lead bonding methods.

Figure 4A:
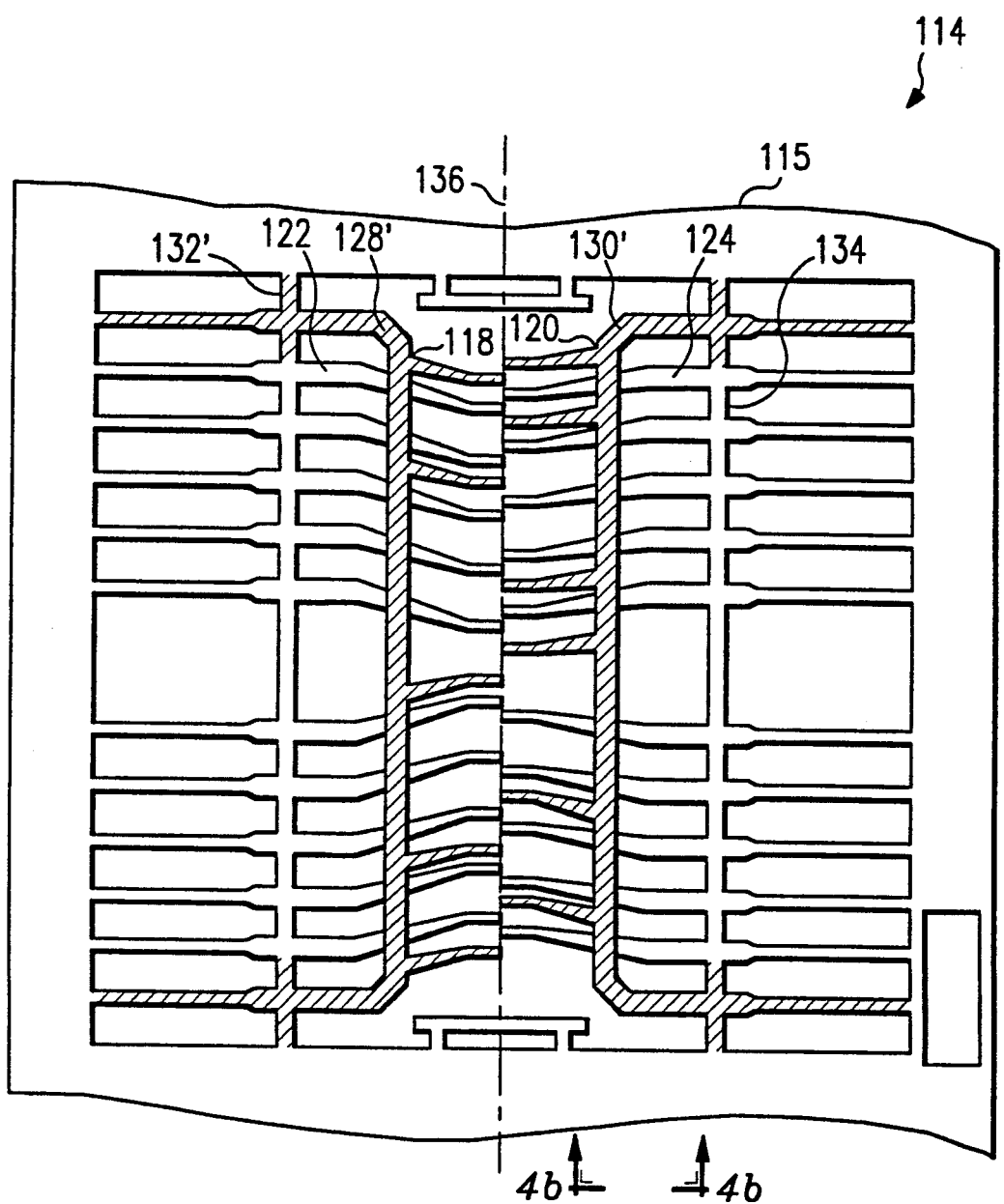
FIGS. 4a and 4b show top and side views, respectively, of an alternative embodiment of the present invention.
Figure 4B:
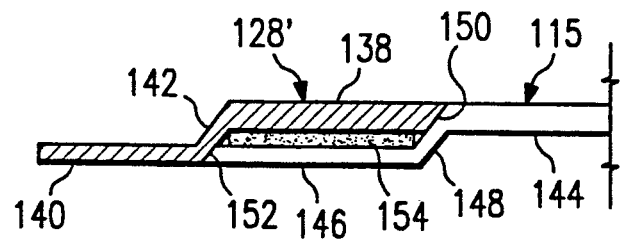

FIGS. 4a and 4b illustrate, respectively, top and side views of an alternative embodiment of the present invention. In particular, bus bar ILB lead frames 128' and 130' are stacked over main lead frame 115 using an adhesive tape. FIG. 4 shows adhesive tape 154 that is placed between top portion 138 of bus bar ILB 128' and bottom portion 146 of main lead frame 115. Tape 154 is a double-sided adhesive tape that is typically used in semiconductor chip manufacturing processes (e.g., comprising a Kapton or polyimide material). In the configuration of 4a and 4b, bus bar lead frame 128' and 130' may extend to external circuitry from main lead frame 115 by connecting and overlying structures 132 and 134 of main lead frame 115.

In summary, there has been shown a double-level lead frame configuration that permits direct inner lead bonding or ILB in a lead-on-chip center bond integrated circuit package and that includes a main lead frame having a plurality of lead frame bond fingers that directly connect to a first plurality of inner bond pads on an integrated chip together with at least one bus bar lead frame that has a plurality of bus bar bond fingers to directly connect to a second plurality of inner bond pads on the integrated circuit chip so that the main lead frame and the bus bar bond fingers permit a lead-on-chip configuration of the main lead frame and the bus bar lead frame.

Although the invention has been described with reference to the above-specified embodiments, this description is not meant to be construed in a limiting sense. Various modifications of the disclosed embodiment, as well as alternative embodiments of the invention will become apparent to persons skilled in the art upon reference to the above description. It is, therefore, contemplated that the appended claims will cover such modifications that fall within the true scope of the invention.

What is claimed is:

1. A device, comprising:
   a semiconductor device having bond pads located in at least one center row of a surface of said semiconductor device;
   a plurality of bond fingers each having a first end directly connected to a respective one of a first plurality of said bond pads and a second end for connection to external circuitry; and
   at least one bus bar having a plurality of bus bar bond fingers for directly connecting to a second plurality of said bond pads and at least one bus bar bond finger for connection to external circuitry.

2. The device of claim 1, wherein said first ends of said plurality of bond fingers are on a first plane relative to said surface of said semiconductor device having bond pads and said at least one bus bar is on a second plane relative to said surface of said semiconductor device.

3. The device of claim 2, wherein said at least one bus bar traverses said first plurality of bond fingers.

4. The device of claim 1, wherein said surface of said semiconductor device is a top surface.

5. The device of claim 2, wherein said first plane is between said surface of said semiconductor device having bond pads and said second plane.

6. The device of claim 1, wherein said second ends of said plurality of bond fingers and said at least one bus bar bond finger for connection to external circuitry are formed around or folded over side surfaces of said semiconductor device.

7. The device of claim 2, including an insulator between said at least one bus bar and said bond fingers on said first plane.

* * * * *